United States Patent
Park

(10) Patent No.: US 10,218,347 B2
(45) Date of Patent: Feb. 26, 2019

(54) HIGH FREQUENCY SWITCH

(71) Applicant: Samsung Electro-Mechanics Co., Ltd., Suwon-si (KR)

(72) Inventor: Sang Wook Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 482 days.

(21) Appl. No.: 14/983,951

(22) Filed: Dec. 30, 2015

(65) Prior Publication Data

US 2016/0269018 A1 Sep. 15, 2016

(30) Foreign Application Priority Data

Mar. 13, 2015 (KR) .................. 10-2015-0035215

(51) Int. Cl.
*H03K 17/0812* (2006.01)
*H02H 9/04* (2006.01)
*H03K 17/693* (2006.01)

(52) U.S. Cl.
CPC ....... *H03K 17/08122* (2013.01); *H02H 9/046* (2013.01); *H03K 17/693* (2013.01)

(58) Field of Classification Search
CPC . H03K 17/08122; H03K 17/693; H02H 9/046
USPC .......................................................... 361/56
See application file for complete search history.

(56) References Cited

U.S. PATENT DOCUMENTS

| 7,199,635 B2* | 4/2007 | Nakatsuka ........... H03K 17/102 327/308 |
| 2008/0013231 A1* | 1/2008 | Bazzano ............ H01L 27/0259 361/56 |
| 2011/0140764 A1 | 6/2011 | Shin et al. |
| 2014/0145782 A1 | 5/2014 | Jeong |

FOREIGN PATENT DOCUMENTS

| JP | 2009-124653 A | 6/2009 |
| KR | 10-2006-0094005 A | 8/2006 |
| KR | 10-2011-0068584 A | 6/2011 |
| KR | 10-2014-0067381 A | 6/2014 |

OTHER PUBLICATIONS

Machine Translation of Furukawa et al. Japanese Patent Document JP 2009-124653 A Jun. 4, 2009.*

* cited by examiner

*Primary Examiner* — Kevin J Comber
(74) *Attorney, Agent, or Firm* — NSIP Law

(57) ABSTRACT

A high frequency switch includes a first signal transferring unit configured to transfer a high frequency signal from a first port to a common port, and a second signal transferring unit configured to transfer the high frequency signal from the common port to a second port. The high frequency switch also includes an electrostatic discharge (ESD) protecting unit including a protective transistor positioned between the common port and a ground and a diode element positioned between a control terminal of the protective transistor and the first port.

19 Claims, 4 Drawing Sheets

HIGH FREQUENCY SWITCH

CROSS-REFERENCE TO RELATED APPLICATION

This application claims the priority and benefit 35 SUC 119(a) of Korean Patent Application No. 10-2015-0035215 filed on Mar. 13, 2015, with the Korean Intellectual Property Office, the disclosure of which is incorporated herein by reference.

BACKGROUND

1. Field

The following description relates to a high frequency switch.

2. Description of Related Art

As wireless communications technology further develops, communications of various communications standards are, at times, used simultaneously. Also, in accordance with miniaturization of a wireless communications modules and improvement in a performance of portable terminals, multiple communications standards are applied to a single portable terminal. In accordance with such a trend of simultaneous use of various communication standards and miniaturization of wireless communication modules, a high frequency switch included in a radio frequency (RF) front-end module and disposed on a signal path between an antenna and an RF chipset has been developed to support communications within various frequency bands.

However, in a case in which the RF chipsets for communications within various frequency bands are simultaneously used, the RF chipsets are frequently damaged due to high frequency signals within different frequency bands. Particularly, because RF chipsets are vulnerable to undesirable peak voltage components, such as electrostatic discharge (ESD) components included in a high frequency signal, it is necessary to block the undesirable peak voltage component in the RF front-end module in advance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a high frequency switch, including: a first signal transferring unit configured to transfer a high frequency signal from a first port to a common port; a second signal transferring unit configured to transfer the high frequency signal from the common port to a second port; and an electrostatic discharge (ESD) protecting unit including a protective transistor positioned between the common port and a ground and a diode element positioned between a control terminal of the protective transistor and the first port.

The protective transistor may include a field effect transistor.

The protective transistor may include an N-channel field effect transistor and the diode element may include an anode connected to the control terminal of the protective transistor and a cathode connected to the first port.

The protective transistor may include a P-channel field effect transistor and the diode element may include a cathode connected to the control terminal of the protective transistor and an anode connected to the first port.

The diode element may include a diode transistor having a diode connection.

A width and a length of a channel of the diode transistor may be configured to turn-on the protective transistor in response to a voltage of the high frequency signal output from the first port being less than a threshold voltage, and may be configured to turn-off the protective transistor in response to a voltage of the high frequency signal output from the first port being equal to the threshold voltage or greater.

Each of the first signal transferring unit and the second signal transferring unit may include switches connected to each other in series.

The high frequency switch may also include a first shunt unit positioned between the first port and the ground; and a second shunt unit positioned between the second port and the ground.

The first signal transferring unit may be in an on-state to conduct a high frequency signal between the first port and the common port, the second signal transferring unit may be in an off-state to block the high frequency signal between the second port and the common port, the first shunt unit may be in an off-state to block the high frequency signal between the first port and the ground, and the second shunt unit may be in an on-state to conduct the high frequency signal between the second port and the ground and prevent the high frequency signal from being transmitted to the second port.

The common port may connected to an antenna.

In accordance with an embodiment, there is provided a high frequency switch, including: a first signal transferring unit configured to transfer a high frequency signal from a first port to a common port; a second signal transferring unit configured to transfer the high frequency signal from the common port to a second port; and an electrostatic discharge (ESD) protecting unit including a protective transistor positioned between the common port and a ground, a diode element positioned between control terminals of a protective transistor and the first port, and a control transistor positioned between the first port and a reference voltage terminal.

The control transistor may receive a control signal through a control terminal thereof.

The control signal may include a low level in an operation section of the first signal transferring unit and may include a high level in an operation section of the second signal transferring unit.

The reference voltage may be a negative voltage or a ground voltage.

The protective transistor may include a field effect transistor.

The protective transistor may include an N-channel field effect transistor and the diode element may include an anode connected to the control terminal of the protective transistor and a cathode connected to the first port.

The protective transistor may include a P-channel field effect transistor and the diode element may include a cathode connected to the control terminal of the protective transistor and an anode connected to the first port.

The diode element may include a diode transistor having a diode connection.

A width and a length of a channel of the diode transistor may be configured to turn-on the protective transistor in response to a voltage of the high frequency signal output from the first port being less than a threshold voltage, and may be configured to turn-off the protective transistor in response to a voltage of the high frequency signal output from the first port being equal to the threshold voltage or greater.

Other features and aspects will be apparent from the following detailed description, the drawings, and the claims.

BRIEF DESCRIPTION OF DRAWINGS

These and/or other aspects will become apparent and more readily appreciated from the following description of the embodiments, taken in conjunction with the accompanying drawings in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
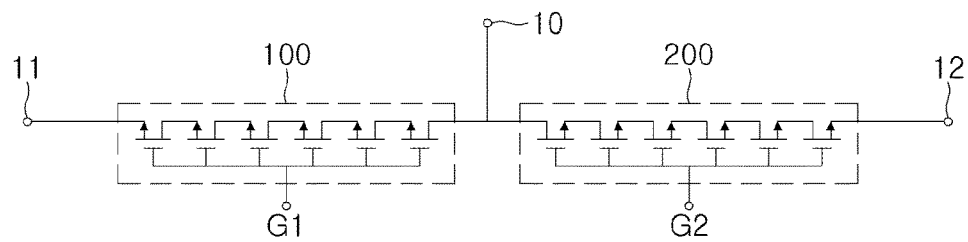
FIGS. 1 and 2 are circuit diagrams illustrating an example of a high frequency switch, in accordance with an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. These terms do not necessarily imply a specific order or arrangement of the elements, components, regions, layers and/or sections. Thus, a first element, component, region, layer or section discussed below could be termed a second element, component, region, layer or section without departing from the teachings description of the present invention.

Figure 2:
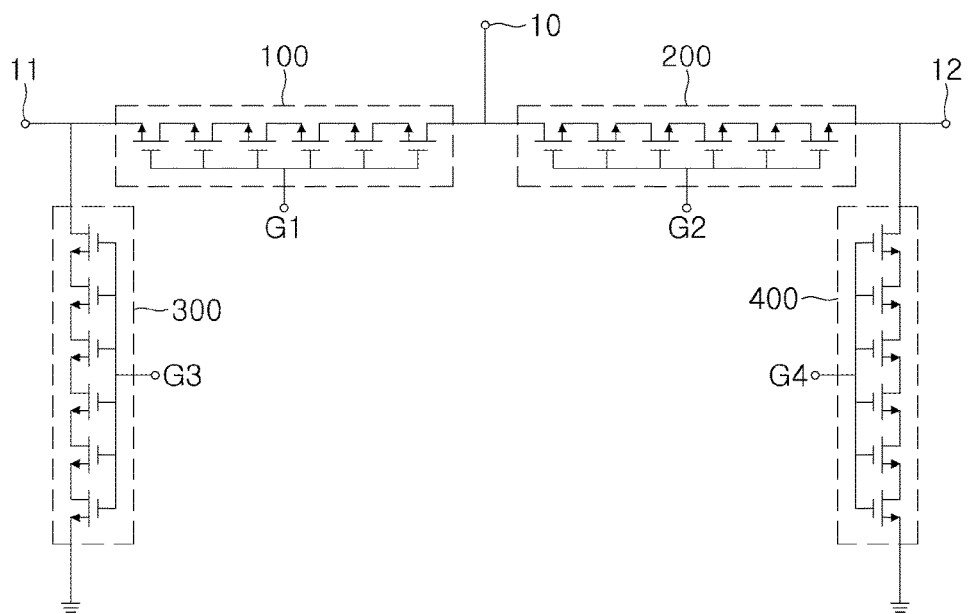

FIGS. 1 and 2 are circuit diagrams illustrating an example of a high frequency switch, in accordance with an embodiment.

Referring to FIG. 1, the high frequency switch includes a first signal transferring unit 100, which includes a plurality of first switching elements and a second signal transferring unit 200, which includes a plurality of second switching elements. Referring to FIG. 2, the high frequency switch also includes a first shunt unit 300, which includes a plurality of third switching elements, and a second shunt unit 400, which includes a plurality of fourth switching elements.

The switching elements included in the first signal transferring unit 100, the second signal transferring unit 200, the first shunt unit 300, and the second shunt unit 400 are connected to each other in series and are switched by receiving gate signals G1, G2, G3, and G4 from a control terminal, respectively.

Each of the first switching elements, the second switching elements, the third switching elements, and the fourth switching elements includes at least one of a field effect transistor (FET) and a bipolar junction transistor (BJT).

For instance, each of the first signal transferring unit 100, the second signal transferring unit 200, the first shunt unit 300, and the second shunt unit 400 includes at least one of a plurality of FETs and a plurality of BJTs, in which each of the FETs has a source and a drain that are connected to each other in series and a gate to which one of the gate signals G1, G2, G3, and G4 is applied. Also, each of the BJTs has an emitter and a collector that are connected to each other in series and a base to which one of the gate signals G1, G2, G3, and G4 is applied.

In one embodiment, as illustrated in FIG. 1, a first gate signal G1 is applied to the first signal transferring unit 100, a second gate signal G2 is applied to the second signal transferring unit 200, a third gate signal G3 is applied to the first shunt unit 300, and a fourth gate signal G4 is applied to the second shunt unit 400.

In accordance with an embodiment, a case in which the first signal transferring unit 100 includes one of first FETs and first BJTs, the second signal transferring unit 200 includes one of second FETs and second BJTs, the first shunt unit 300 includes one of third FETs and third BJTs, and the second shunt unit 400 includes one of fourth FETs and fourth BJTs will be described.

Although FIG. 1 illustrates the FETs as being the first, the second, the third, and the fourth switching elements included in the signal transferring units 100 and 200 and the shunt units 300 and 400, respectively, the first, the second, the third, and the fourth switching elements included in the signal transferring units 100 and 200 and the shunt units 300 and 400 are not limited to the FETs. For example, the first and second signal transferring units 100 and 200 and the first and second shunt units 300 and 400 may also include at least one of the above-mentioned BJTs.

In addition, although FIG. 1 illustrates the FETs as N-channel FETs, a person skilled in the art can appreciate that the FETS include P-channel FETs as well as the N-channel FETs. Further, in a case in which the BJTs are used as the first, the second, the third, and the fourth switching elements, both NPN BJTs and PNP BJTs may be used.

More specifically, although FIG. 1 illustrates a case in which the number of first and second FETs is six, the embodiment is not limited to the number of first and second FETs described above. For example, a number of each of the first and second FETs may be two or more.

In one illustrative example, a description is provided for an embodiment in which each of the first and second signal transferring units 100 and 200 and each of the first and second shut units 300 and 400 include the N-channel FETs as the switching elements.

The high frequency switch is connected to a common port 10 and first and second ports 11 and 12. As illustrated in FIG. 1, one end of each of the first signal transferring unit 100 and the second signal transferring unit 200 are commonly connected to the common port 10, the other end of the first signal transferring unit 100 is connected to the first port 11, and the other end of the second signal transferring unit 200 is connected to the second port 12. In one example, the common port 10 is connected to an antenna transmitting or receiving a high frequency signal.

The first signal transferring unit 100 transfers the high frequency signal received at the common port 10, through the antenna, to the first port 11 as a reception signal and transfer a high frequency signal output from the first port 11 to the common port 10 as a transmission signal. Hereinafter, the high frequency signal transferred between the first port 11 and the common port 10 is referred to as a first high frequency signal.

In addition, the second signal transferring unit 200 transfers the high frequency signal received at the common port 10, through the antenna, to the second port 12 as a reception signal and transfer a high frequency signal output from the second port 12 to the common port 10 as a transmission signal. Hereinafter, the high frequency signal transferred between the second port 12 and the common port 10 is referred to as a second high frequency signal.

In an example, the first signal transferring unit 100 and the second signal transferring unit 200 perform any one of transmitting at least one of the first and the second high frequency signals, respectively, and receiving at least one of the first and the second high frequency signals, respectively. For example, in a case in which the first signal transferring unit 100 transfers a transmitted radio frequency signal, from the first port 11 to the common port 10, the second signal transferring unit 200 transfers a received radio frequency signal from the common port 10 to the second port 12.

Hereinafter, for convenience of explanation, descriptions will be provided of the first signal transferring unit 100 transferring the transmission signal output from the first port 11 to the common port 10, and the second signal transferring unit 200 transferring the reception signal input from the common port 10 to the second port 12.

The first shunt unit 300 and the second shunt unit 400 are disposed between the first port 11 and a ground and between the second port 12 and a ground, respectively, to bypass residual signals of the first signal transferring unit 100 and the second signal transferring unit 200 to the ground. Although the first shunt unit 300 and the second shunt unit 400 are illustrated to be separate from the first signal transferring unit 100 and the second signal transferring unit 200, respectively, according to another embodiment, the first shunt unit 300 may be an integral structural element of the first signal transferring unit 100 and the second shunt unit 400 may be an integral structural element of the second signal transferring unit 200.

Figure 3:
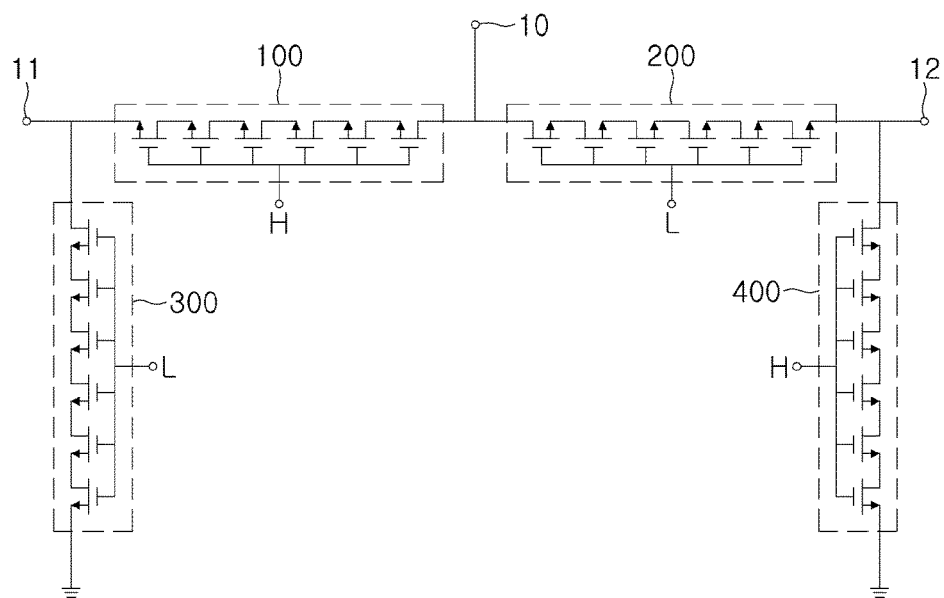
FIG. 3 is a circuit diagram illustrating an operation of the high frequency switch of FIG. 2, in accordance with an embodiment.

FIG. 3 is a circuit diagram illustrating an operation of the high frequency switch of FIG. 2. Hereinafter, the operation of the high frequency switch will be described with reference to FIG. 3.

In an example of FIG. 3, the first signal transferring unit 100 performs a switching operation in the same scheme as that of the second shunt unit 400, and the second signal transferring unit 200 performs a switching operation in the same scheme as that of the first shunt unit 300. For instance, in this case, the first and fourth gate signals G1 and G4 are the same as each other, while the second and third gate signals G2 and G3 are the same as each other.

A description will be provided with reference to FIGS. 2 and 3 on an illustrative example in which the first and fourth gate signals G1 and G4 applied to the first signal transferring unit 100 and the second shunt unit 400, respectively, are high (H) signals, and the second and third gate signals G2 and G3 applied to the second signal transferring unit 200 and the second shunt unit 400, respectively, are low (L) signals. However, a description of a case in which the first and fourth gate signals G1 and G4 are low (L) signals and the second and third gate signals G2 and G3 are high (H) signals will be omitted with reference to a description to be provided below.

The first signal transferring unit 100 is in an on-state to conduct signals between the first port 11 and the common port 10, and the second signal transferring unit 200 is in an off-state to block signals between the second port 12 and the common port 10. In addition, the first shunt unit 300 is in an off-state to block signals between the first port 11 and the ground, and the second shunt unit 400 is in an on-state to conduct signals between the second port 12 and the ground. In this case, a path from the first port 11 to the common port 10 is in an operating state.

Therefore, in this case, the first signal transferring unit 100 is operated in the on-state, such that the first high frequency signal is smoothly transmitted between the first port 11 and the common port 10, and the second signal transferring unit 200 and the first shunt unit 300 are operated in the off-state, such that a possible flow of the first high frequency signal is blocked. The second shunt unit 400 positioned in the front end of the second port 12 is operated in the on-state to prevent the first high frequency signal from being transmitted to the second port 12, thus, improving isolation characteristics of the high frequency switch.

As described above, the first signal transferring unit 100 and the second shunt unit 400 respectively receive the gate signals G1 and G4 having the same level as each other to perform the same switching operation. In turn, the second signal transferring unit 200 and the first shunt unit 300 respectively receive with the gate signals G2 and G3 having the same level as each other to perform the same switching operation.

Figure 4:
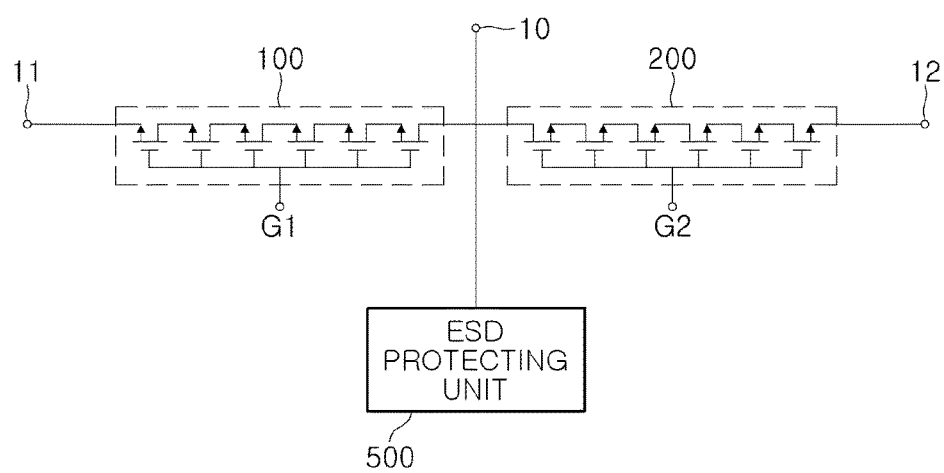
FIGS. 4 and 5 are circuit diagrams illustrating a high frequency switch, in accordance with an embodiment.
Figure 5:
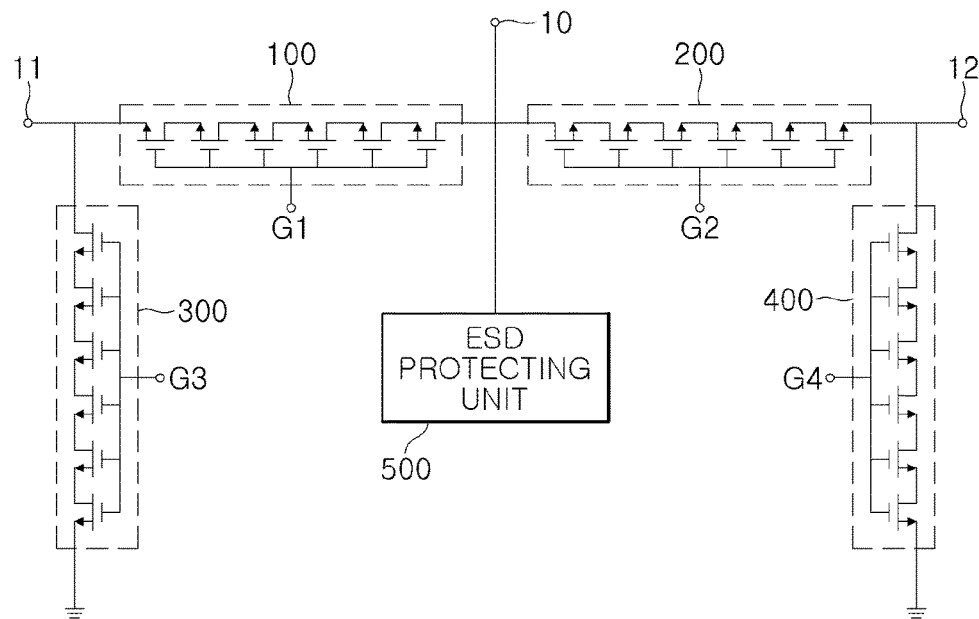

FIGS. 4 and 5 are circuit diagrams illustrating a high frequency switch, according to an embodiment.

Referring to FIG. 4, the high frequency switch includes the first signal transferring unit 100, a second signal transferring unit 200, and an electrostatic discharge (ESD) protecting unit 500. Referring to FIG. 5, the high frequency switch also includes the first shunt unit 300 and the second shunt unit 400.

The ESD protecting unit 500 is connected to the common port 10. The ESD protecting unit 500 bypasses an ESD component of the high frequency signal received at the antenna, connected to the common port 10, to the ground. As a result, the ESD protecting unit 500 prevents the ESD component of the received high frequency signal from being transferred to the first port 11 and the second port 12 through the first signal transferring unit 100 and the second signal transferring unit 200, respectively.

In addition, when the first port 11 is a transmission side and the second port 12 is a reception side, a signal strength of the high frequency signal transmitted from the first port 11 to the common port 10 is larger than a signal strength of the high frequency signal transmitted from the common port 10 to the second port 12. The ESD protecting unit 500, according to the embodiment, includes switching elements arranged to be stacked (that is, connected to each other in series) to divide a voltage of the high frequency signal transmitted from the common port 10 to the second port 12 by each of the switching elements.

The first high frequency signal is transmitted to the second port 12 through the second signal transferring unit 200 to prevent the circuit elements connected to the second port 12 from breaking.

Figure 6:
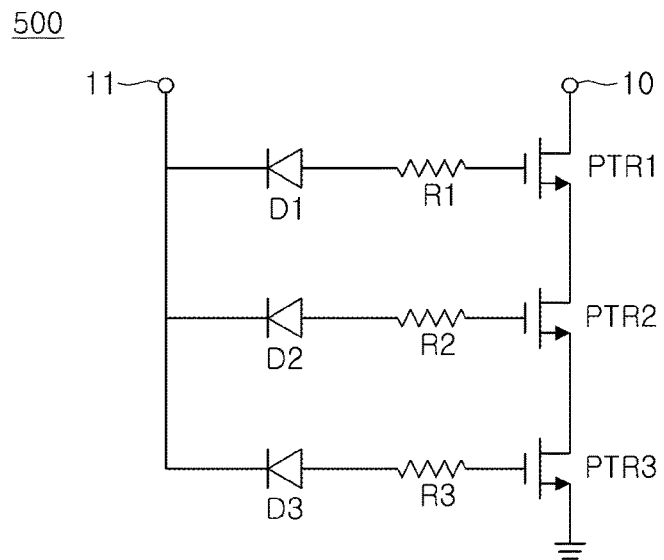
FIGS. 6 through 8 are circuit diagrams of an electrostatic discharge (ESD) protecting unit, in accordance with an embodiment.
Figure 7:
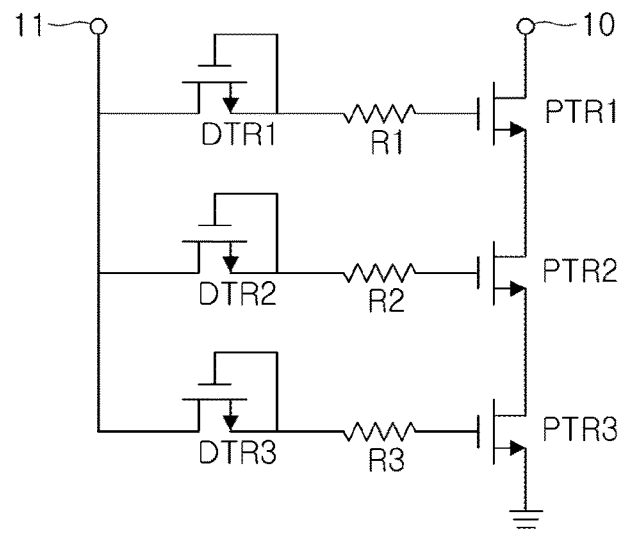
Figure 8:
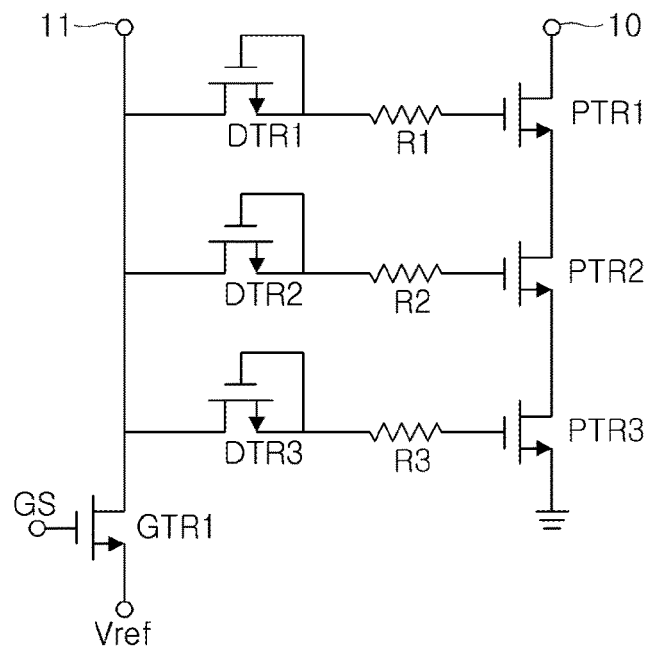

FIGS. 6 through 8 are circuit diagrams of the ESD protecting unit, according to an embodiment.

Referring to FIG. 6, the ESD protecting unit 500 includes one or more protective transistors PTR1 to PTR3 arranged to be stacked (connected to each other in series) between the common port 10 and the ground. The ESD protecting unit 500 also includes one or more diode elements D1 to D3 disposed between a control terminal of each of one or more protective transistors PTR1 to PTR3 and the first port 11. In addition, the ESD protecting unit 500 further includes one or more gate resistors R1 to R3 arranged between each of one or more protective transistors PTR1 to PTR3 and each of one or more diode elements D1 to D3.

Each of one or more protective transistors PTR1 to PTR3 includes a field effect transistor (FET). In this example, the FET is implemented as an N channel FET as illustrated in FIG. 6. In the alternative, the FET is implemented as a P channel FET.

Each of one or more diode elements D1 to D3 is disposed between the control terminal of each of one or more protective transistors PTR1 to PTR3 and the first port 11.

Directions of an anode and a cathode of each of one or more diode elements D1 to D3 are configured depending on a type of channel of the field effect transistor included in the one or more protective transistors PTR1 to PTR3. For example, in an example in which the field effect transistor is the N channel FET, as illustrated in FIG. 6, each of the one or more diode elements D1 to D3 has the cathode connected to the first port 11 and the anode connected to the control terminal of each of the one or more protective transistors PTR1 to PTR3.

In addition, unlike as is illustrated in FIG. 6, in an example in which one or more protective transistors PTR1 to PTR3 are implemented as a P channel FET, directions of the diodes are opposite to the directions illustrated in FIG. 6.

Each of one or more diode elements D1 to D3 includes corresponding diode transistors DTR1 to DTR3. Referring to FIG. 7, the diode transistors DTR1 to DTR3 include a diode connected field effect transistor (DC FET) constituted by a diode connection. In an alternative embodiment, the diode transistors DTR1 to DTR3 may include a diode connected bipolar junction transistor (DC BJT) formed by the diode connection. In an example, the DC FET is implemented as one of an N-channel FET and a P-channel FET, and the DC BJT is implemented as one of an NPN BJT and a PNP BJT.

A connection form of the DC FET or the DC BJT is determined depending on positions of the anodes and the cathodes of the diode elements D1 to D3, described above. As an example, as illustrated in FIG. 7, in an embodiment in which one or more protective transistors PTR1 to PTR3 are implemented as the N-channel FET, the P-channel DC FET includes a source connected to the control terminal of each of the protective transistors PTR1 to PTR3, a drain connected to the first port 11, and a gate connected to the source.

When the high frequency switch is normally operated, the protective transistors PTR1 to PTR3 of the ESD protecting unit 500 are turned-off so as not to influence the operations of the first signal transferring unit 100 and the second signal transferring unit 200.

However, in a case in which an ESD component is present in the high frequency signal received at the common port 10 through the antenna, nodes of the protective transistors PTR1 to PTR3 connected to the common port 10 are at a high level, such that the protective transistors PTR1 to PTR3 are turned-on. As the protective transistors PTR1 to PTR3 are turned-on, the ESD component included in the high frequency signal introduced into the common port 10 is bypassed to the ground to prevent a signal having a withstand voltage or more from being transferred to the circuit elements, which are connected to the first port 11 and the second port 12.

In addition, in a case in which an abnormally high negative voltage component is included in the high frequency signal transferred to the common port 10 from the first port 11, at the transmission side, the abnormally high negative voltage component is transferred to the protective transistors PTR1 to PTR3 through the diode transistors DTR1 to DTR3 connected to the first port 11. As a result, the protective transistors PTR1 to PTR3 are well maintained in the off-state than when normally operating and are configured to divide the abnormally high negative voltage component through the common port 10 to protect a circuit.

A voltage difference across the diode transistors DTR1 to DTR3, respectively, are adjusted by changing a width and a length of a channel of each of the diode transistors DTR1 to DTR3. The width and the length of the channel of each of the diode transistors DTR1 to DTR3 is set so that the protective transistors PTR1 to PTR3 are turned-on in a case in which the voltage of the high frequency signal output from the first port 11 is less than a threshold voltage. Also, the width and the length of the channel of each of the diode transistors DTR1 to DTR3 are set so that the protective transistors PTR1 to PRT3 are turned-off in a case in which the voltage of the high frequency signal output from the first port 11 is the threshold voltage or greater.

Referring to FIG. 8, the ESD protecting unit 500, according to an embodiment, also includes a control transistor GTR1 disposed between the first port 11 and a reference voltage Vref terminal.

The control transistor GTR1 includes at least one of a field effect transistor (FET) and a bipolar junction transistor (BJT). In an example, the FET is implemented as one of an N-channel FET and a P-channel FET, and the BJT is implemented as one of an NPN BJT and a PNP BJT. Hereinafter, for convenience of explanation, descriptions will be provided about the control transistor GTR1 being an N-channel FET.

The control transistor GTR1 includes a drain connected to the first port 11, a source connected to the reference voltage Vref terminal, and a gate to which a control signal GS is applied. In an example, the reference voltage Vref is a voltage of a low level or a ground voltage.

In an example in which the first signal transferring unit 100 transmits the high frequency signal input from the first port 11 to the common port 10, the control signal has a low level. The control signal GS of the low level is applied to the control transistor GTR1, such that the control transistor GTR1 is turned-off. The control transistor GTR1 is turned-off such that a voltage of the input port 11 is applied to the diode transistors DTR1 to DTR3.

In an example in which the high frequency signal of the input port 11 is in a normal range, the protective transistors PTR1 to PTR3 are turned-off so as not to influence an operation of the first signal transferring unit 100 and the second signal transferring unit 200. In an example in which the abnormally high negative voltage component is included in the high frequency signal of the input port 11, the protective transistors PTR1 to PTR3 are well maintained in the off-state than when the high frequency signal is in the normal range.

In addition, in a case in which the second signal transferring unit 200 transmits the high frequency signal input from the common port 10 to the second port 12, the control signal has a high level. The control signal GS of the high level is applied to the control transistor GTR1 to turn-on the control transistor GTR1. Therefore, the reference voltage Vref is applied to the diode transistors DTR1 to DTR3. As described above, the reference voltage Vref is a low level voltage. The low level reference voltage Vref is applied to the diode transistors DTR1 to DTR3, such that the protective transistors PTR1 to PTR3 are turned-off.

However, in an example in which the ESD component is present in the high frequency signal received at the common port 10, the nodes of the protective transistors PTR1 to PTR3 connected to the common port 10 are at high level, such that the protective transistors PTR1 to PTR3 are turned-on to prevent the circuit elements connected to the first port 11 and the second port 12 from breaking.

As set forth above, according to various embodiments, the high frequency switch blocks in advance an abnormal peak voltage component such as an electrostatic discharge (ESD) component, which may be included in the high frequency signal.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A high frequency switch, comprising:
a first signal circuit portion configured to transfer a high frequency signal from a first port to a common port;
a second signal circuit portion configured to transfer the high frequency signal from the common port to a second port; and
an electrostatic discharge (ESD) protecting unit comprising a protective transistor positioned between the common port and a ground and a diode element positioned between a control terminal of the protective transistor and the first port.

2. The high frequency switch of claim 1, wherein the protective transistor comprises a field effect transistor.

3. The high frequency switch of claim 1, wherein the protective transistor comprises an N-channel field effect transistor and the diode element comprises an anode connected to the control terminal of the protective transistor and a cathode connected to the first port.

4. The high frequency switch of claim 1, wherein the protective transistor comprises a P-channel field effect transistor and the diode element comprises a cathode connected to the control terminal of the protective transistor and an anode connected to the first port.

5. The high frequency switch of claim 1, wherein the diode element comprises a diode transistor having a diode connection.

6. The high frequency switch of claim 5, wherein a width and a length of a channel of the diode transistor are configured to turn-on the protective transistor in response to a voltage of the high frequency signal output from the first port being less than a threshold voltage, and configured to turn-off the protective transistor in response to a voltage of the high frequency signal output from the first port being equal to the threshold voltage or greater.

7. The high frequency switch of claim 1, wherein each of the first signal circuit portion—and the second signal circuit portion comprises switches connected to each other in series.

8. The high frequency switch of claim 1, further comprising:
a first shunt circuit portion positioned between the first port and the ground; and
a second shunt circuit portion positioned between the second port and the ground.

9. The high frequency switch of claim 8, wherein
the first signal circuit portion is in an on-state to conduct a high frequency signal between the first port and the common port,
the second signal circuit portion is in an off-state to block the high frequency signal between the second port and the common port,
the first shunt circuit portion is in an off-state to block the high frequency signal between the first port and the ground, and
the second shunt circuit portion is in an on-state to conduct the high frequency signal between the second port and the ground and prevent the high frequency signal from being transmitted to the second port.

10. The high frequency switch of claim 1, wherein the common port is connected to an antenna.

11. A high frequency switch, comprising:
a first signal circuit portion configured to transfer a high frequency signal from a first port to a common port;
a second signal circuit portion configured to transfer the high frequency signal from the common port to a second port; and
an electrostatic discharge (ESD) protecting unit comprising a protective transistor positioned between the common port and a ground, a diode element positioned between control terminals of a protective transistor and the first port, and a control transistor positioned between the first port and a reference voltage terminal.

12. The high frequency switch of claim 11, wherein the control transistor receives a control signal through a control terminal thereof.

13. The high frequency switch of claim 12, wherein the control signal comprises a low level in an operation section of the first signal circuit portion and comprises a high level in an operation section of the second signal circuit portion.

14. The high frequency switch of claim 11, wherein the reference voltage is a negative voltage or a ground voltage.

15. The high frequency switch of claim 11, wherein the protective transistor comprises a field effect transistor.

16. The high frequency switch of claim 11, wherein the protective transistor comprises an N-channel field effect transistor and the diode element comprises an anode connected to the control terminal of the protective transistor and a cathode connected to the first port.

17. The high frequency switch of claim 16, wherein the protective transistor comprises a P-channel field effect transistor and the diode element comprises a cathode connected to the control terminal of the protective transistor and an anode connected to the first port.

18. The high frequency switch of claim 11, wherein the diode element comprises a diode transistor having a diode connection.

19. The high frequency switch of claim 18, wherein a width and a length of a channel of the diode transistor are configured to turn-on the protective transistor in response to a voltage of the high frequency signal output from the first port being less than a threshold voltage, and configured to turn-off the protective transistor in response to a voltage of the high frequency signal output from the first port being equal to the threshold voltage or greater.

* * * * *